(12) United States Patent
Sasaki et al.

(10) Patent No.: US 10,396,187 B2
(45) Date of Patent: Aug. 27, 2019

(54) SEMICONDUCTOR DEVICE

(71) Applicant: Japan Display Inc., Tokyo (JP)

(72) Inventors: Toshinari Sasaki, Tokyo (JP);
Masahiro Watabe, Tokyo (JP);
Masayoshi Fuchi, Tokyo (JP); Isao Suzumura, Tokyo (JP); Marina Shiokawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/880,673

(22) Filed: Jan. 26, 2018

(65) Prior Publication Data

US 2018/0226498 A1    Aug. 9, 2018

(30) Foreign Application Priority Data

Feb. 9, 2017    (JP) .................................. 2017-022065

(51) Int. Cl.
*H01L 29/66* (2006.01)
*H01L 21/385* (2006.01)
*H01L 29/786* (2006.01)
*H01L 21/477* (2006.01)

(52) U.S. Cl.
CPC ...... *H01L 29/66969* (2013.01); *H01L 21/385* (2013.01); *H01L 21/477* (2013.01); *H01L 29/7869* (2013.01); *H01L 29/78609* (2013.01)

(58) Field of Classification Search
CPC .................... H01L 29/66969; H01L 21/385
USPC ........................................................ 257/43
See application file for complete search history.

(56) References Cited

U.S. PATENT DOCUMENTS

| | | | |
|---|---|---|---|
| 9,269,821 B2 * | 2/2016 | Yamazaki | H01L 29/78696 |
| 2011/0057186 A1 * | 3/2011 | Yamazaki | H01L 27/1225 257/43 |
| 2012/0286260 A1 | 11/2012 | Noda et al. | |
| 2014/0110707 A1 * | 4/2014 | Koezuka | H01L 29/7869 257/43 |
| 2015/0076497 A1 * | 3/2015 | Yamazaki | H01L 27/1225 257/43 |
| 2017/0054028 A1 * | 2/2017 | Sasaki | H01L 29/7869 |
| 2017/0186875 A1 * | 6/2017 | Yamazaki | H01L 21/28568 |

FOREIGN PATENT DOCUMENTS

JP     2016-139819 A    8/2016

* cited by examiner

*Primary Examiner* — Igwe U Anya
(74) *Attorney, Agent, or Firm* — Michael Best & Friedrich LLP

(57) ABSTRACT

A semiconductor device including a first oxide insulating layer, a barrier layer above the first oxide insulating layer, the barrier layer including an opening, a second oxide insulating layer above the first oxide insulating layer at a position overlapping the opening, an oxide semiconductor layer facing the first oxide insulating layer interposed by the second oxide insulating layer at a position overlapping the opening, a gate electrode facing the oxide semiconductor layer at side opposite to the first oxide insulating layer with respect to the oxide semiconductor layer, and a gate insulating layer between the oxide semiconductor layer and the gate electrode. A contained amount of oxygen in the first oxide insulating layer is larger than a contained amount of oxygen in the second oxide insulating layer.

14 Claims, 11 Drawing Sheets

SEMICONDUCTOR DEVICE

CROSS REFERENCE TO RELATED APPLICATIONS

This application is based upon and claims the benefit of priority from the prior Japanese Patent Application No. 2017-022065, filed on Feb. 9, 2017, the entire contents of which are incorporated herein by reference.

FIELD

One embodiment of the present invention is related to a semiconductor device. One embodiment of the present invention is related to a semiconductor device in which an oxide semiconductor layer is used as a semiconductor layer.

BACKGROUND

In recent years, the development of semiconductor devices which use an oxide semiconductor for a channel in place of amorphous silicon, low temperature polysilicon and single crystal silicon has been proceeding (for example, Japanese Laid Open Patent Publication No. 2016-139819). A semiconductor device which uses an oxide semiconductor as a channel can be formed with a simple structure and at a low temperature process similar to a semiconductor device which uses amorphous silicon as a channel. It is known that a semiconductor device which uses an oxide semiconductor as a channel has higher mobility than a semiconductor device which uses amorphous silicon as a channel. It is known that a semiconductor device which uses an oxide semiconductor as a channel has a low off-current.

In the top-gate type oxide semiconductor transistor disclosed in Japanese Laid Open Patent Publication No. 2016-139819, it is a problem to achieve both a reduction of the resistance of a source/drain region and an increase of the resistance of the channel region. In oxide semiconductors, carriers are generated due to oxygen defects, thereby the resistance value of the oxide semiconductor is reduced. That is, in the channel region, a treatment (oxidation treatment for example) for compensating for the oxygen defects is necessary, and in the source/drain region, a treatment (reduction treatment for example) for generating oxygen defects is necessary. For example, Japanese Laid Open Patent Publication No. 2016-139819 discloses a method of reducing the resistance of an oxide semiconductor layer in a source/drain region by a reduction treatment after the oxide semiconductor layer as a whole has been provided with high resistance using an oxidation treatment.

As is disclosed in Japanese Laid Open Patent Publication No. 2016-139819, in order to reduce the resistance of the source/drain region selectively in a top-gate oxide semiconductor transistor, it was necessary to perform special low resistance treatments such as a reduction treatment.

SUMMARY

A semiconductor device related to one embodiment of the present invention includes a first oxide insulating layer, a barrier layer above the first oxide insulating layer, the barrier layer including an opening, a second oxide insulating layer above the first oxide insulating layer at a position overlapping the opening, an oxide semiconductor layer facing the first oxide insulating layer interposed by the second oxide insulating layer at a position overlapping the opening, a gate electrode facing the oxide semiconductor layer at side opposite to the first oxide insulating layer with respect to the oxide semiconductor layer, and a gate insulating layer between the oxide semiconductor layer and the gate electrode. A contained amount of oxygen in the first oxide insulating layer is larger than a contained amount of oxygen in the second oxide insulating layer.

A semiconductor device related to one embodiment of the present invention includes a first oxide insulating layer, a ratio of oxygen in the first oxide insulating layer being larger than a ratio of oxygen in a composition ratio of a stoichiometry composition of the first oxide insulating layer, a barrier layer above the first oxide insulating layer, the barrier layer including an opening, an oxide semiconductor layer facing the first oxide insulating layer at a position overlapping the opening, a gate electrode facing the oxide semiconductor layer at side opposite to the first oxide insulating layer with respect to the oxide semiconductor layer, and a gate insulating layer between the oxide semiconductor layer and the gate electrode.

A semiconductor device related to one embodiment of the present invention includes a gate electrode, a gate insulating layer above the gate electrode, an oxide semiconductor layer above the gate insulating layer, the oxide semiconductor layer overlapping the gate electrode, a second oxide insulating layer above the oxide semiconductor layer, a barrier layer above the second oxide insulating layer, the barrier layer including an opening at a position overlapping the gate electrode, and a first oxide insulating layer facing the oxide semiconductor layer at a position overlapping the opening, a contained amount of oxygen in the first oxide insulating layer being larger than a contained amount of oxygen in the second oxide insulating layer.

A semiconductor device related to one embodiment of the present invention includes a gate electrode, a gate insulating layer above the gate electrode, an oxide semiconductor layer above the gate insulating layer, the oxide semiconductor layer overlapping the gate electrode, a barrier layer above the oxide semiconductor layer, the barrier layer including an opening at a position overlapping the gate electrode, and a first oxide insulating layer facing the oxide semiconductor layer at a position overlapping the opening, a ratio of oxygen in the first oxide insulating layer being larger than a ratio of oxygen in a composition ratio of a stoichiometry composition of the first oxide insulating layer.

DESCRIPTION OF EMBODIMENTS

Figure 1:
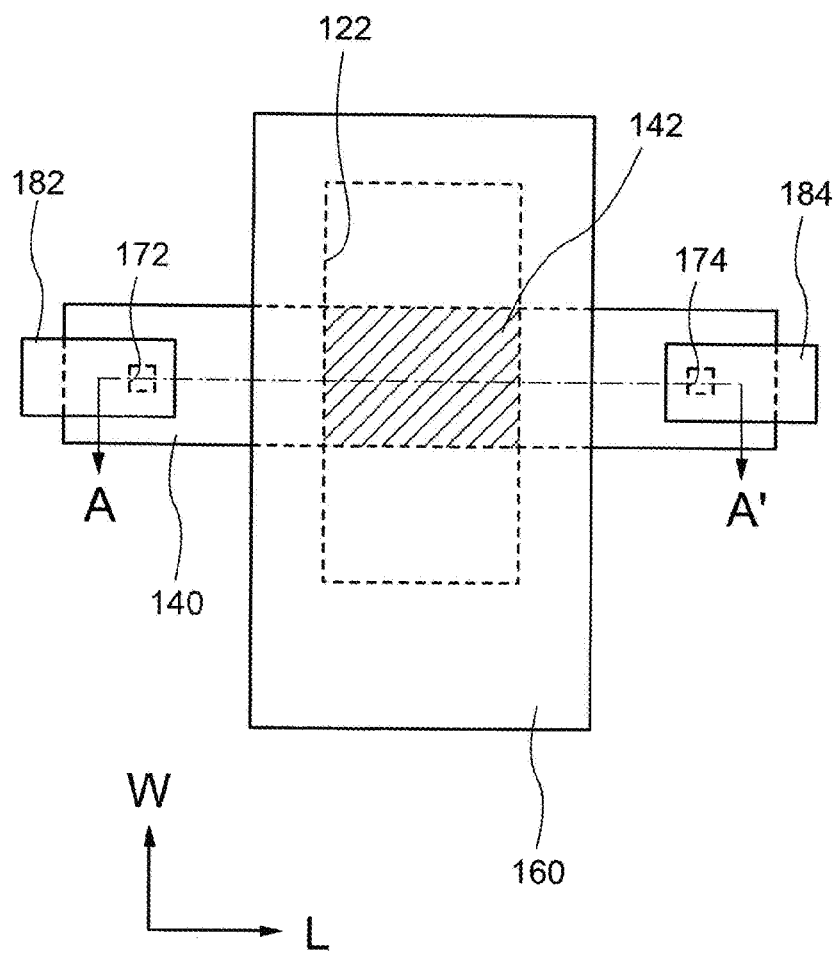
FIG. 1 is a planar view diagram showing an outline of a semiconductor device related to one embodiment of the present invention.

Each embodiment of the present invention is explained below while referring to the drawings. Furthermore, the disclosure is merely an example, and those skilled in the art can of course easily conceive of changes in keeping with the concept of the invention which are included in the scope of the present invention. Although the drawings may be schematically represented in terms of the width, thickness and shape and the like of each part as compared with the actual form in order to make explanation clearer, the drawings are only an example and an interpretation of the present invention is not limited thereto. In addition, in the present specification and each drawing, elements similar to those described with reference to the preceding drawings may be attached with the same reference symbols followed by a letter of the alphabet and a detailed explanation thereof may be omitted as appropriate. An object of the following embodiments is to provide a semiconductor device capable of efficiently realizing a low resistance region and a high resistance region of an oxide semiconductor using a simple process.

First Embodiment

An outline of a semiconductor device 10 according to the first embodiment of the present invention is explained while referring to FIG. 1 to FIG. 10. The semiconductor device 10 according to the first embodiment is used for each pixel and drive circuit of a Liquid Crystal Display Device (LCD), a self-light emitting display using a self-light emitting element such as an Organic Light-Emitting Diode (OLED) device or a quantum dot, or reflection type display devices such as electronic paper and the like.

The semiconductor device according to one embodiment of the present invention is not limited to those used for display devices. For example, the semiconductor device according to the present invention may also be used for an Integrated Circuit (IC) such as a Micro-Processing Unit (MPU). The semiconductor device 10 of the first embodiment is a semiconductor device having a structure in which an oxide semiconductor is used as a semiconductor.

[Structure of Semiconductor Device 10]

Figure 2:
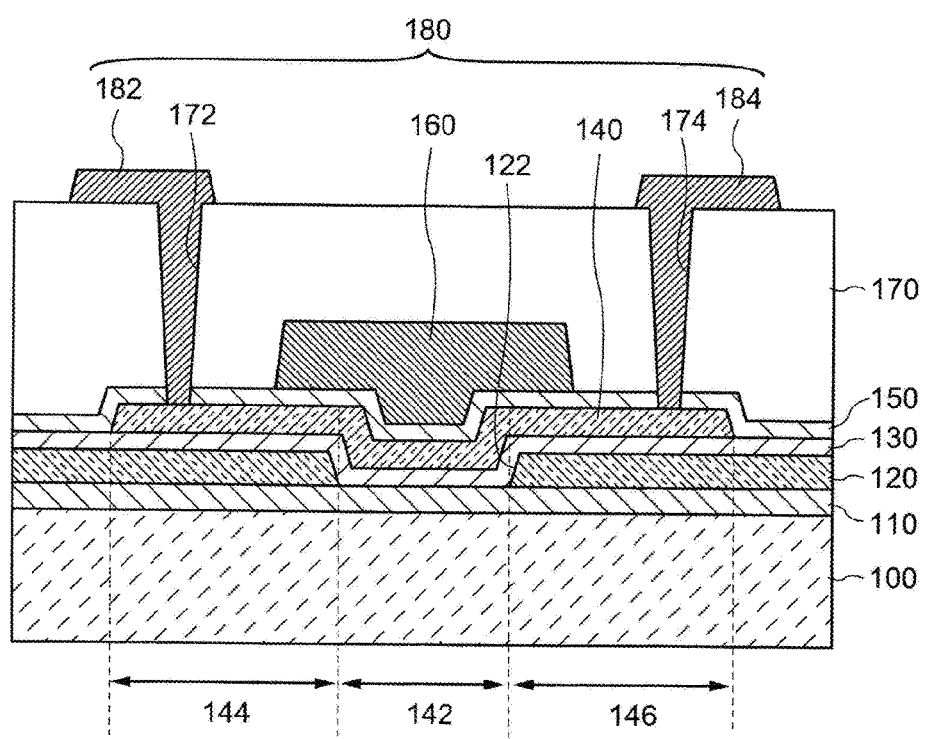
FIG. 2 is a cross-sectional diagram showing an outline of a semiconductor device related to one embodiment of the present invention.

FIG. 1 is a planar view diagram showing an outline of a semiconductor device according to one embodiment of the present invention. FIG. 2 is a cross-sectional diagram showing an outline of a semiconductor device according to one embodiment of the present invention. The cross-sectional view in FIG. 2 is a cross-sectional view taken along line A-A' in FIG. 1. As is shown in FIG. 1 and FIG. 2, the semiconductor device 10 includes a substrate 100, a first oxide insulating layer 110, an oxygen blocking layer 120, a second oxide insulating layer 130, an oxide semiconductor layer 140, a gate insulating layer 150, a gate electrode 160, an interlayer insulating layer 170, and a source/drain electrode 180 (source electrode 182 and drain electrode 184). The oxygen blocking layer 120 may simply be called a barrier layer.

The first oxide insulating layer 110 is arranged above the substrate 100. The oxygen blocking layer 120 is arranged above the first oxide insulating layer 110. The oxygen blocking layer 120 has an opening 122. The opening 122 exposes the first oxide insulating layer 110. The second oxide insulating layer 130 is arranged above the oxygen blocking layer 120 and the first oxide insulating layer 110 exposed by the opening 122. In other words, the second oxide insulating layer 130 is arranged above the first oxide insulating layer 110 at a position overlapping the opening 122 in a planar view. The oxide semiconductor layer 140 is arranged above the second oxide insulating layer 130. The oxide semiconductor layer 140 is arranged in at least a region overlapping with the opening 122 in a planar view. The oxide semiconductor layer 140 faces the first oxide insulating layer 110 interposed with the second oxide insulating layer 130 therebetween at a position overlapping with the opening 122 in a planar view. In other words, the oxide semiconductor layer 140 is separated from the oxygen blocking layer 120 by the second oxide insulating layer 130. The oxide semiconductor layer 140 is divided into a channel region 142, a source region 144 and a drain region 146.

The gate insulating layer 150 is arranged above the oxide semiconductor layer 140 and the second oxide insulating layer 130 exposed from the oxide semiconductor layer 140. In other words, the gate insulating layer 150 is arranged between the oxide semiconductor layer 140 and the gate electrode 160. The gate electrode 160 is arranged above the gate insulating layer 150. That is, the gate electrode 160 faces the oxide semiconductor layer 140 on a side opposite to the first oxide insulating layer 110 with respect to the oxide semiconductor layer 140. The gate electrode 160 is arranged in at least a region overlapping with the opening 122 in a planar view. The gate electrode 160 overlaps with a part of the oxide semiconductor layer 140 of the source region 144 and the drain region 146. The interlayer insulating layer 170 is arranged above the gate electrode 160 and on the gate insulating layer 150 exposed from the gate electrode 160. In the interlayer insulating layer 170 and the gate insulating layer 150, an opening 172 reaching the oxide semiconductor layer 140 in the source region 144, and an opening 174 reaching the oxide semiconductor layer 140 in the drain region 146 are arranged. The source electrode 182 is arranged within the opening 172. The drain electrode 184 is arranged within the opening 174. The source electrode 182 and the drain electrode 184 are in contact with the oxide semiconductor layer 140. In the case when the source electrode 182 and the drain electrode 184 are not particularly distinguished, they are collectively called source/drain electrode 180.

The positional relationship between the opening 122 and the oxide semiconductor layer 140, and the positional relationship between the opening 122 and the gate electrode 160 is explained while referring to FIG. 1. In the following explanation, a direction from the source electrode 182 towards the drain electrode 184 (direction connecting the source electrode 182 and the drain electrode 184) is referred to as direction L, and a direction orthogonal to the direction L is referred to as direction W. The direction L corresponds to the direction of the channel length of the semiconductor device 10, and the direction W corresponds to the direction of the channel width. In the direction L, the length of the gate electrode 160 is larger than the length of the opening 122. In the direction W, the width of the opening 122 is larger than the width of the oxide semiconductor layer 140. In other words, in the direction W, a pattern of the opening 122 crosses a pattern of the oxide semiconductor layer 140. That is, the pattern of the oxide semiconductor layer 140 is separated into the source electrode 182 side and the drain electrode 184 side by the pattern of the opening 122. Although details are described later, the region shown by the hatching in FIG. 1 is the channel region 142 of the semiconductor device 10.

As shown in FIG. 1 and FIG. 2, the channel region 142 corresponds to a region where the region of the first oxide insulating layer 110 is exposed by the opening 122 and where the oxide semiconductor layer 140 overlaps in a planar view. The end part in the direction L of the channel region 142 does not have to be perfectly aligned with the end part in the direction L of the opening 122. That is, in the direction L, the channel region 142 may be wider or narrower than the opening 122. In other words, the end part in the direction L of the channel region 142 may sandwich the end part in the direction L of the opening 122, and conversely, the end part in the direction L of the opening 122 may sandwich the end part in the direction L of the channel region 142. The resistivity of the channel region 142 is higher than the resistivity of the source region 144 and the drain region 146.

Although a structure in which the substrate 100 and the first oxide insulating layer 110 are in contact with each other is exemplified in FIG. 2, the present embodiment is not limited to this structure. For example, an underlayer may be arranged between the substrate 100 and the first oxide insulating layer 110. Furthermore, a light shielding layer may also be arranged between the underlying layer and the first oxide insulating layer 110. The light shielding layer may be arranged in at least a region overlapping with the channel region 142 in a planar view.

[Material of Each Member]

An insulating substrate containing a resin such as a polyimide substrate, an acrylic substrate, a siloxane substrate or a fluorine resin substrate can be used as the substrate 100. Impurities may be introduced into the substrate in order to improve heat resistance of the substrate 100. In particular, in the case when the semiconductor device 10 is a top emission type display, it is not necessary that the substrate 100 be transparent. Therefore, the substrate 100 may contain impurities that deteriorate transparency. On the other hand, in the case when it is not necessary for the substrate 100 to have flexibility, a translucent insulating substrate such as a glass substrate, a quartz substrate or a sapphire substrate can be used as the substrate 100. In the case where the semiconductor device 10 is used for an integrated circuit which is not a display device, semiconductor substrates such as a silicon substrate, a silicon carbide substrate or a compound semiconductor substrate, or a conductive substrate such as a stainless substrate or a substrate which does not have translucency can be used as the substrate 100.

The first oxide insulating layer 110 includes a large amount of excess oxygen. The contained amount of oxygen in the first oxide insulating layer 110 is larger than the contained amount of oxygen in the second oxide insulating layer 130. In other words, a ratio of oxygen contained in the first oxide insulating layer 110 is larger than a ratio of oxygen in a composition ratio of a stoichiometry composition of the insulator used for the first oxide insulating layer 110, and discharges oxygen by a heat treatment. Oxygen within the first oxide insulating layer 110 includes dangling bonds. A bonding energy of the first oxide insulating layer 110 is lower than a bonding energy of the composition ratio of the stoichiometry composition of the insulator used for the first oxide insulating layer 110. Therefore, oxygen atoms are discharged from the first oxide insulating layer 110 by a heat treatment at 450° C. or lower for example. Since oxygen within the first oxide insulating layer 110 includes dangling bonds, the first oxide insulating layer 110 has many defects. The first oxide insulating layer 110 includes a lot of nitrogen the same as oxygen. That is, in the first oxide insulating layer 110, a ratio of nitrogen contained in the first oxide insulating layer 110 is larger than a ratio of nitrogen in a composition ratio of the stoichiometry composition of the insulator used for the first oxide insulating layer 110, and nitrogen is discharged by a heat treatment.

It is possible to use an oxide insulator such as silicon oxide ($SiO_x$) and silicon oxynitride ($SiO_xN_y$) as the first oxide insulating layer 110 (x and y are arbitrary positive numerical values). The film thickness of the first oxide insulating layer 110 can be appropriately selected within a range of 100 nm or more and 1 μm or less. It is sufficient that the first oxide insulating layer 110 has characteristics for discharging oxygen by a heat treatment, and a metal oxide other than silicon oxide may be used as the first oxide insulating layer 110. The first oxide insulating layer 110 does not have to include defects. Similarly, the first oxide insulating layer 110 may be a layer which does not discharge nitrogen.

The number of atomic bonds of Si is four, and the number of atomic bonds of O is two. Therefore, the composition ratio of the stoichiometry composition of $SiO_x$ is Si:O=1:2. In the case when $SiO_x$ is used as the first oxide insulating layer 110, x has a value larger than 2. As is described later, in the case when $SiO_x$ is used for both of the first oxide insulating layer 110 and the second oxide insulating layer 130, the value of x of the first oxide insulating layer 110 is lower than the value x of the second oxide insulating layer 130.

In the present embodiment, although an insulating layer (first oxide insulating layer 110) is exemplified as a layer which includes an excessive amount of oxygen and discharges oxygen by a heat treatment, a conductive layer or a semiconductor layer may be used instead of first oxide insulating layer 110.

The oxygen blocking layer 120 suppresses the permeation of oxygen discharged from the first oxide insulating layer 110 by a heat treatment. The oxygen blocking layer 120 has a lower permeability with respect to oxygen than the second oxide insulating layer 130 which is arranged above the oxygen blocking layer 120. It is preferred that the oxygen blocking layer 120 hardly allows oxygen to pass through. The oxygen referred to here is not limited to oxygen molecules or oxygen atoms, and also includes a substance which contains an oxygen atom such as water for example. The oxygen blocking layer 120 may be simply called a barrier layer.

An oxide material such as aluminum oxide ($AlO_x$) and aluminum oxynitride ($AlO_xN_y$) or the like can be used as the oxygen blocking layer 120. $AlO_x$ has a high blocking ability against oxygen. In other words, $AlO_x$ has very low oxygen permeability. The film thickness of the oxygen blocking layer 120 can be appropriately selected from within a range of 10 nm or more and 100 nm or less. For example, in the case where the aluminum oxide is formed by a reactive sputtering method, argon (Ar) which is a sputtering process gas may be included in the oxygen blocking layer 120. It is sufficient that the oxygen blocking layer 120 suppresses the permeation of oxygen discharged from the first oxide insulating layer 110, and a metal oxide other than aluminum oxide may also be used as the oxygen blocking layer 120. A nitride such as aluminum nitride oxide ($AlN_xO_y$) and aluminum nitride ($AlN_x$) or the like may also be used as the oxygen blocking layer 120 in addition to the metal oxide.

In the case where $AlO_x$ is used as the oxygen blocking layer 120, it is preferred that the second oxide insulating layer 130 is arranged between the oxygen blocking layer 120 and the oxide semiconductor layer 140. In other words, in the case when $AlO_x$ is used as the oxygen blocking layer 120, it is preferred that the oxide semiconductor layer 140 is separated from the oxygen blocking layer 120 by the second oxide insulating layer 130. $AlO_x$ may have many defects which are electron traps. Therefore, when $AlO_x$ is in contact with the oxide semiconductor layer 140, the threshold voltage of the semiconductor device 10 may fluctuate. Since the oxygen blocking layer 120 and the oxide semiconductor layer 140 are separated by the second oxide insulating layer 130, even in the case where a material including a large amount of electron traps is used as the oxygen blocking layer 120, it is possible to reduce the influence of the electron traps on the driving of the semiconductor device 10.

Although an insulating layer is exemplified as an oxygen blocking layer in the present embodiment, a conductive layer or a semiconductor layer may also be used in addition to the insulating layer.

The second oxide insulating layer 130 has fewer defects compared to the first oxide insulating layer 110. The ratio of oxygen contained in the second oxide insulating layer 130 is closer to a ratio of oxygen in the composition ratio of the stoichiometry composition of the insulator used for the second oxide insulating layer 130 compared to the first oxide insulating layer 110, and it is difficult to discharge oxygen even if a heat treatment is performed. In other words, the excess oxygen included in the second oxide insulating layer 130 is smaller than the excess oxygen included in the first oxide insulating layer 110. Similar to oxygen, the ratio of nitrogen contained in the second oxide insulating layer 130 is closer to a ratio of nitrogen in a composition ratio of the stoichiometry composition of the insulator used for the second oxide insulating layer 130 compared to the first oxide insulating layer 110. That is, and it is difficult for the second oxide insulating layer 130 to discharge nitrogen even if a heat treatment is performed. In other words, the excess nitrogen included in the second oxide insulating layer 130 is less than the excess nitrogen included in the first oxide insulating layer 110.

It is possible to use oxide materials such as $SiO_x$ and $SiO_xN_y$ as the second oxide insulating layer 130 similar to the first oxide insulating layer 110. A TEOS layer may be used as the second oxide insulating layer 130. The TEOS layer refers to a CVD layer which uses TEOS (Tetra Ethyl Ortho Silicate) as a raw material. The film thickness of the second oxide insulating layer 130 can be appropriately selected within a range from 10 nm or more to 50 nm or less.

It is sufficient that the second oxide insulating layer 130 has the characteristic of less defects and a metal oxide other than silicon oxide may be used as the second oxide insulating layer 130. The second oxide insulating layer 130 may also be a layer that discharges oxygen and nitrogen.

In the case when $SiO_x$ is used as the second oxide insulating layer 130, x has a value close to 2. In the case where $SiO_x$ is used for both the first oxide insulating layer 110 and the second oxide insulating layer 130, the value of x of the second oxide insulating layer 130 is smaller than the value of x of the first oxide insulating layer 110.

$SiO_xN_y$ and $AlO_xN_y$ explained above are a silicon compound and an aluminum compound containing a less amount of nitrogen (N) than oxygen (O). $SiN_xO_y$ and $AlN_xO_y$ are a silicon compound and an aluminum compound containing less oxygen than nitrogen.

A metal oxide having semiconductor characteristics can be used as the oxide semiconductor layer 140. For example, it is possible to use an oxide semiconductor containing indium (In), gallium (Ga), zinc (Zn) and oxygen (O) as the oxide semiconductor layer 140. In particular, it is possible to use an oxide semiconductor having a composition ratio of In:Ga:Zn:O=1:1:1:4 as the oxide semiconductor layer 140. The film thickness of the oxide semiconductor layer 140 can be appropriately selected within a range of 20 nm or more and 100 nm or less. However, the oxide semiconductor containing In, Ga, Zn and O used in the present invention is not limited to the composition described above. It is possible to use an oxide semiconductor having a composition different from the oxide semiconductor described above as the oxide semiconductor. For example, the ratio of In may be increased in order to improve mobility. The ratio of Ga may also be increased in order to increase a band gap and reduce the influence of light irradiation.

Other elements may be added to the oxide semiconductor including In, Ga, Zn and O. For example, a metal element such as Al and Sn and the like may be added to the oxide semiconductor. Apart from the oxide semiconductors described above, zinc oxide (ZnO), nickel oxide (NiO), tin oxide ($SnO_2$), titanium oxide ($TiO_2$), vanadium oxide ($VO_2$), indium oxide ($In_2O_3$) and strontium titanate ($SrTiO_3$) can be used as the oxide semiconductor layer 140. The oxide semiconductor layer 140 may be amorphous or crystalline. The oxide semiconductor layer 140 may also be a mixed phase of amorphous and crystal.

An inorganic insulating material such as $SiO_x$, $SiO_xN_y$, $SiN_x$, $SiN_xO_y$, $AlO_x$, $AlO_xN_y$, $AlN_x$ and $AlN_xO_y$ or the like can be used as the gate insulating layer 150. A structure in which the insulating layers described above are stacked can be used as the gate insulating layer 150. The film thickness of the gate insulating layer 150 can be appropriately selected from within a range of 50 nm or more and 300 nm or less. It is preferred to use a layer having fewer defects than the first oxide insulating layer 110 as the gate insulating layer 150. In other words, it is preferred to use, a ratio of oxygen contained in the gate insulating layer 150 is closer to a ratio of oxygen in a composition ratio of the stoichiometry composition of the insulator used for the gate insulating layer 150 compared to the first oxide insulating layer 110.

A general metal material or a conductive semiconductor material can be used as the gate electrode 160. For example, a metal such as aluminum (Al), titanium (Ti), chromium (Cr), cobalt (Co), nickel (Ni), zinc (Zn), molybdenum (Mo), indium (In), tin (Sn), hafnium (Hf), tantalum (Ta), tungsten (W), platinum (Pt) or bismuth (Bi) and the like can be used as the gate electrode 160. An alloy of these materials may be used, or a nitride of these materials may be used as the gate electrode 160. A conductive oxide material such as ITO (indium tin oxide), IGO (indium gallium oxide), IZO (indium zinc oxide), GZO (zinc oxide added with gallium as a dopant) may be used as the gate electrode 160. A structure in which these films are stacked may also be used as the gate electrode 160. The film thickness of the gate electrode 160 can be appropriately selected from within a range of 50 nm or more and 1 µm or less.

It is preferred to use a material which has a work function that becomes an enhancement type in which a transistor is switched OFF when 0V is applied to the gate electrode 160 as a material used as the gate electrode 160.

An inorganic insulating material such as $SiO_x$, $SiO_xN_y$, $AlO_x$, $AlO_xN_y$ and a TEOS layer or the like can be used as the interlayer insulating layer 170. In addition to the inorganic insulating materials described above, an organic insulating material can be used as the interlayer insulating layer 170. Polyimide resin, acrylic resin, epoxy resin, silicone resin, fluororesin or siloxane resin and the like can be used as the organic insulating material 170. A structure in which the insulating layers described above are stacked may also be used as the interlayer insulating layer 170. The film thickness of the interlayer insulating layer 170 can be appropriately selected from within a range of 100 nm or more and 1 µm or less. Similar to the first oxide insulating layer 110, it is preferred to use, a ratio of oxygen contained in the interlayer insulating layer 170 is larger than a ratio of oxygen in a composition ratio of the stoichiometry composition of the insulator used for the interlayer insulating layer 170.

A general metal material or a conductive semiconductor material can be used as the source/drain electrode 180 similar to the gate electrode 160. For example, Al, Ti, Cr, Co, Ni, Zn, Mo, In, Sn, Hf, Ta, W, Pt, Bi, or the like can be used as the source/drain electrode 180. An alloy of these materials may also be used or nitrides of these materials may be used as the source/drain electrode 180. A conductive oxide semiconductor such as ITO, IGO, IZO, GZO or the like may be used as the source/drain electrode 180, or a structure in which these films are stacked may also be used. The film thickness of the source/drain electrode 180 can be appropriately selected from within a range of 50 nm or more and 1 µm or less.

[Manufacturing Method of Semiconductor Device 10]

Figure 3:
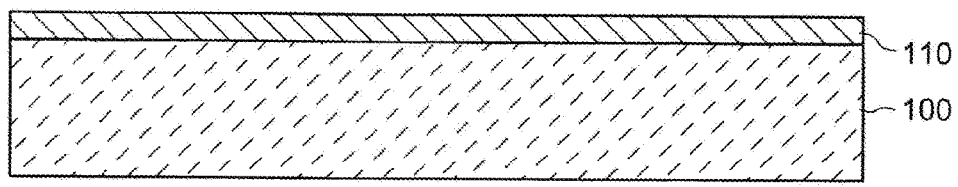
FIG. 3 is a cross-sectional diagram showing a process for forming a first oxide insulating layer in a manufacturing method of a semiconductor device related to one embodiment of the present invention.

A manufacturing method of the semiconductor device 10 according to the first embodiment of the present invention is explained while referring to the cross-sectional views in FIG. 3 to FIG. 7. FIG. 3 is a cross-sectional view showing a process for forming a first oxide insulating layer in the method of manufacturing a semiconductor device according to one embodiment of the present invention. As is shown in FIG. 3, the first oxide insulating layer 110 is formed above the substrate 100. The first oxide insulating layer 110 can be formed by a physical vapor deposition (PVD) method or a chemical vapor deposition (CVD) method. A sputtering method, a vacuum evaporation method, an electron beam evaporation method and a molecular beam epitaxy method and the like is used as the PVD method. A thermal CVD method, a plasma CVD method, a catalytic CVD method (Cat (Catalytic)-CVD method or a hot wire CVD method) or the like is used as the CVD method. In the present embodiment, $SiO_x$ is formed as the first oxide insulating layer 110 by a plasma CVD method.

The film formation conditions of the first oxide insulating layer 110 are adjusted so that the first oxide insulating layer 110 includes an excess of oxygen within the film. For example, by forming a film under the conditions of low temperature, low $SiH_4$ flow rate, high power and high pressure, it is possible to form the first oxide insulating layer 110 including a large amount of excess oxygen. The first oxide insulating layer 110 formed under the conditions described above includes a large number of oxygen atoms having dangling bonds. Regarding the oxygen atoms in such a bonded state, a bonding energy of the first oxide insulating layer 110 is lower than the bonding energy of the composition ratio of the stoichiometry composition of the insulator used for the first oxide insulating layer 110. Therefore, the oxygen atoms are discharged from the first oxide insulating layer 110 by a heat treatment at 450° C. or lower for example.

Figure 4:
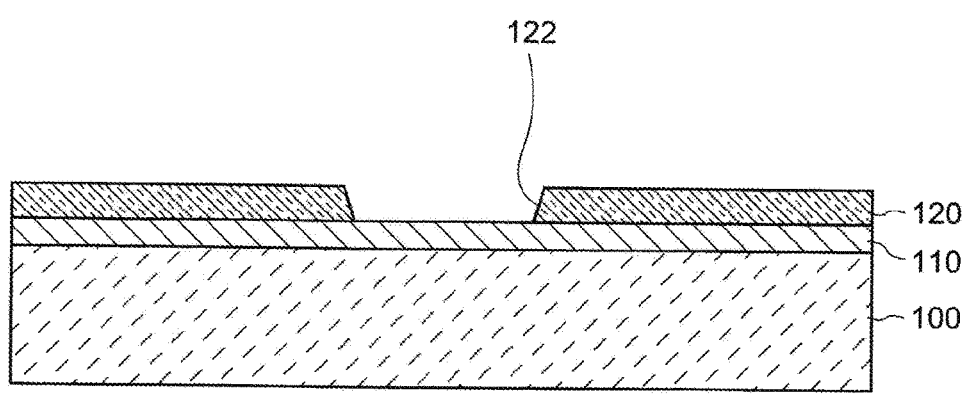
FIG. 4 is a cross-sectional diagram showing a process for forming an oxygen blocking layer in a manufacturing method of a semiconductor device related to one embodiment of the present invention.

FIG. 4 is a cross-sectional view showing a process for forming an oxygen blocking layer in the method of manufacturing a semiconductor device according to one embodiment of the present invention. As is shown in FIG. 4, an insulating layer including an oxygen blocking layer 120 is formed on the entire surface of the substrate shown in FIG. 3, and an opening 122 is formed by photolithography and etching. It is possible to form the oxygen blocking layer 120 by the PVD method or CVD method described above. In the present embodiment, $AlO_x$ is formed as the oxygen blocking layer 120 using a reactive sputtering method.

A sputtering method using an Ar gas and an $O_2$ gas with respect to an aluminum target is used as a reactive sputtering method for forming the oxygen blocking layer 120. These gases are called process gases used in sputtering methods. By forming the oxygen blocking layer 120 using the reactive sputtering method, it is possible to form a high density layer with a low oxygen permeability. Furthermore, the 02 gas used in the reactive sputtering method is ionized within a plasma, attracted to the film formation substrate and implanted into the substrate. In particular, oxygen ions at the beginning of film formation are also implanted into the first oxide insulating layer 110 which is an underlayer of the oxygen blocking layer 120. In this way, it is possible to further increase the amount of excess oxygen in the first oxide insulating layer 110 by forming the oxygen blocking layer 120 by the reactive sputtering method using oxygen as a process gas. Therefore, the first oxide insulating layer 110 can discharge more oxygen in a subsequent heat treatment.

Figure 5:
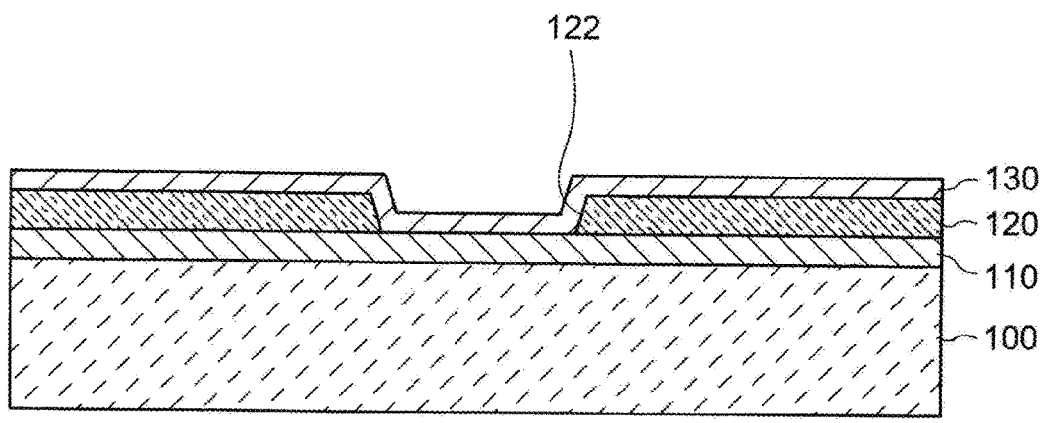
FIG. 5 is a cross-sectional diagram showing a process for forming a second oxide insulating layer in a manufacturing method of a semiconductor device related to one embodiment of the present invention.

FIG. 5 is a cross-sectional view showing a process for forming a second oxide insulating layer in the method of manufacturing a semiconductor device according to one embodiment of the present invention. As is shown in FIG. 5, the second oxide insulating layer 130 is formed above the oxygen blocking layer 120 and the first oxide insulating layer 110 exposed by the opening 122. It is possible to form the second oxide insulating layer 130 using the PVD method or CVD method described above. In the present embodiment, $SiO_x$ is formed as the second oxide insulating layer 130 using a plasma CVD method.

The film formation conditions of the second oxide insulating layer 130 are different from the film formation conditions of the first oxide insulating layer 110 so that defects within the second oxide insulating layer 130 are fewer than the defects in the first oxide insulating layer 110. For example, it is possible to form the second oxide insulating layer 130 under the film formation conditions of high temperature and low power condition compared with the film formation conditions of the first oxide insulating layer 110. The second oxide insulating layer 130 formed under these conditions includes fewer oxygen atoms having dangling bonds. In other words, the ratio of oxygen contained in the second oxide insulating layer 130 is closer to the ratio of oxygen in the composition ratio of the stoichiometry composition of the insulator used for the second oxide insulating layer 130 compared to the first oxide insulating layer 110. Therefore, the oxygen atoms included in the second oxide insulating layer 130 are bonded by the bonding energy at the composition ratio of the stoichiometry composition of the insulator used for the second oxide insulating layer 130. Therefore, even if a heat treatment is performed at about 450° C., oxygen atoms are not discharged from the second oxide insulating layer 130.

Figure 6:
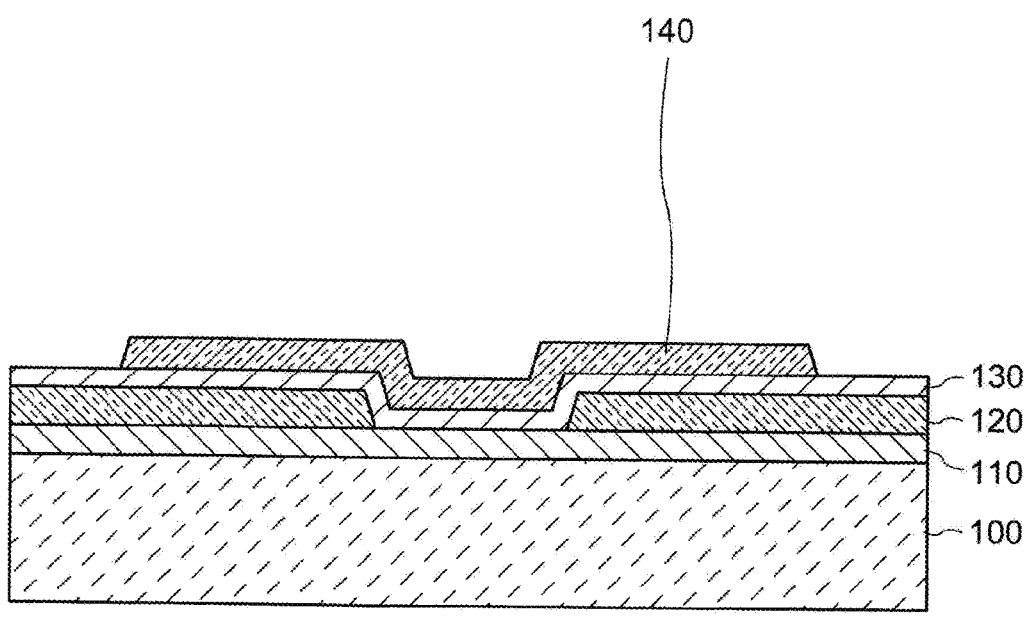
FIG. 6 is a cross-sectional diagram showing a process for forming an oxide semiconductor layer in a manufacturing method of a semiconductor device related to one embodiment of the present invention.

FIG. 6 is a cross-sectional view showing a process for forming an oxide semiconductor layer in the method for manufacturing a semiconductor device according to one embodiment of the present invention. As is shown in FIG. 6, an oxide semiconductor layer including the oxide semiconductor layer 140 is formed above the entire surface of the substrate shown in FIG. 5, and a pattern of the oxide semiconductor layer 140 is formed by photolithography and etching.

It is possible to form the oxide semiconductor layer including the oxide semiconductor layer 140 using a sputtering method. Etching of the oxide semiconductor layer may be performed by dry etching or wet etching. In the case of forming the oxide semiconductor layer 140 using wet etching, an etchant including an oxalic acid can be used. A heat treatment may be performed at 250° C. to 450° C. after forming the oxide semiconductor layer 140.

Figure 7:
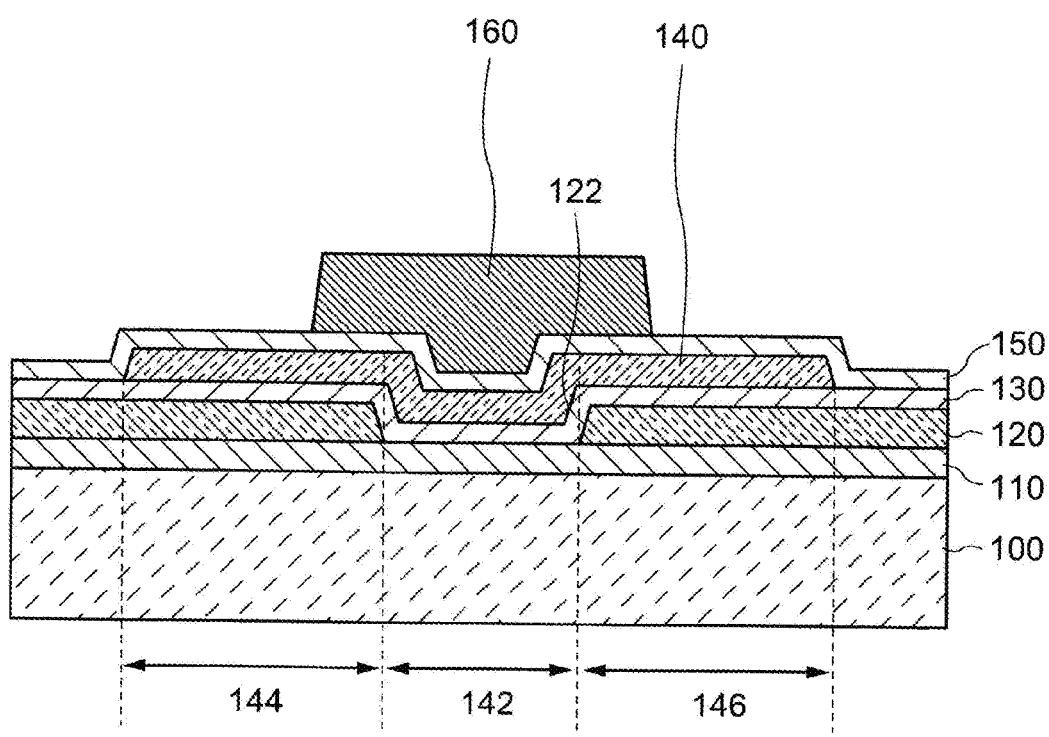
FIG. 7 is a cross-sectional diagram showing a process for forming a gate insulating layer and a gate electrode in a manufacturing method of a semiconductor device related to one embodiment of the present invention.

FIG. 7 is a cross-sectional view showing a process for forming a gate insulating layer and a gate electrode in a method of manufacturing a semiconductor device according to one embodiment of the present invention. As is shown in FIG. 7, an insulating layer including the gate insulating layer 150 and a conductive layer including the gate electrode 160 are formed above the entire surface of the substrate shown in FIG. 6, and a pattern of the gate electrode 160 is formed using photolithography and etching. It is possible to form the gate insulating layer 150 using the PVD method or CVD method described above. The gate electrode 160 can be formed using the PVD method described above. In the present embodiment, $SiO_x$ is formed as the gate insulating layer 150 using a plasma CVD, and a molybdenum-tungsten alloy (MoW) is formed as the gate electrode 160 using a sputtering method.

Silane ($SiH_4$) gas is used as a process gas in the case when $SiO_x$ is formed as the gate insulating layer 150 using a plasma CVD method. Activated hydrogen atoms are generated by decomposing silane in a plasma. Silane or hydrogen atoms have a strong reduction function to the oxide semiconductor layer 140. That is, when silane or hydrogen atoms are in contact with the oxide semiconductor layer 140, these react with oxygen within the oxide semiconductor layer 140 whereby oxygen is discharged from the oxide semiconductor layer 140. When oxygen is discharged from the oxide semiconductor layer 140 oxygen defects are generated in the oxide semiconductor layer 140. The oxygen defects become carriers which lowers resistivity of the oxide semiconductor layer 140. That is, immediately after the formation of the gate insulating layer 150, the channel region 142, the source region 144 and the drain region 146 of the oxide semiconductor layer 140 are all in a state of low resistance.

When a heat treatment is performed at 250° C. or more and 450° C. or less in the state shown in FIG. 7, oxygen is discharged from the first oxide insulating layer 110. Oxygen discharged from the first oxide insulating layer 110 can not pass through the oxygen blocking layer 120. Therefore, the oxygen passes through the opening 122 and reaches the oxide semiconductor layer 140. When oxygen discharged from the first oxide insulating layer 110 reaches the oxide semiconductor layer 140, oxygen defects formed in the oxide semiconductor layer 140 at the time of forming the gate insulating layer 150 are repaired. In this way, oxygen defects within the oxide semiconductor layer 140 are reduced. Oxygen discharged from the first oxide insulating layer 110 by a heat treatment reaches the oxide semiconductor layer 140 which overlaps with the opening 122 in a planar view. Therefore, oxygen defects in the oxide semiconductor layer 140 in the channel region 142 are selectively repaired. As a result, the oxide semiconductor layer 140 in the channel region 142 becomes a high resistance layer with few oxygen defects, and the oxide semiconductor layer 140 in the source region 144 and the drain region 146 becomes a low resistance layer with many oxygen defects.

An interlayer insulating layer 170 is formed above the gate insulating layer 150 and the gate electrode 160. Openings 172 and 174 which expose the oxide semiconductor layer 140 of the source region 144 and the drain region 146 are formed in the interlayer insulating layer 170. Next, by forming the source electrode 182 and the drain electrode 184 in contact with the oxide semiconductor layer 140 of the source region 144 and the drain region 146 via the openings 172 and 174, it is possible to obtain the semiconductor device 10 shown in FIG. 2.

As is described above, the oxide semiconductor layer 140 of the source region 144 and the drain region 146 has a relatively low resistance, and the oxide semiconductor layer 140 of the channel region 142 has a relatively high resistance. Carriers are hardly generated in the oxide semiconductor layer 140 of the channel region 142 in a state where an OFF voltage (0V for example) at which the semiconductor device 10 is turned off is applied to the gate electrode 160. Therefore, the oxide semiconductor layer 140 in the channel region 142 is in a non-conducting state. On the other hand, carriers are generated in the oxide semiconductor layer 140 in a state where an ON voltage (+5V for example (in the case when the oxide semiconductor layer 140 is an n-type semiconductor)) at which the semiconductor device 10 is turned on is applied to the gate electrode 160. Therefore, the oxide semiconductor layer 140 in the channel region 142 is in a conducting state.

Since the oxide semiconductor layer 140 of the source region 144 and the drain region 146 has low resistance independent of the voltage applied to the gate electrode 160, it is possible to suppress a voltage drop due to the oxide semiconductor layer 140 from the source electrode 182 to the channel region 142 and the oxide semiconductor layer 140 from the channel region 142 to the drain electrode 184. As a result, it is possible to obtain a high ON current of the semiconductor device 10 in an ON state.

In the explanation of the manufacturing method above, although a case where the first oxide insulating layer 110 contains a large amount of excessive oxygen immediately after film formation was explained, the manufacturing method is not limited to this example. For example, oxygen may be implanted into the first oxide insulating layer 110 after forming the first oxide insulating layer 110 including no excess oxygen or a small amount of excess oxygen. It is possible to use an implantation method of oxygen ions as a method of implanting oxygen into the first oxide insulating layer 110. The implantation of oxygen ions can be performed using an ion doping method, an ion implantation method or a reactive sputtering method and the like.

In the explanation of the manufacturing method above, although a manufacturing method was explained in which the resistance of the oxide semiconductor layer 140 in the channel region 142 is increased by performing a heat treatment after forming the gate insulating layer 150 and the gate electrode 160 above the oxide semiconductor layer 140, the present embodiment is not limited to this manufacturing method. For example, by forming the gate insulating layer 150 at a high temperature of 300° C. or more, oxygen defects in the oxide semiconductor layer 140 are generated and at the same time oxygen defects may be repaired due to a discharge of oxygen from the first oxide insulating layer 110.

[Gas Discharge Characteristics of First Oxide Insulating Layer and Second Oxide Insulating Layer]

Figure 8:
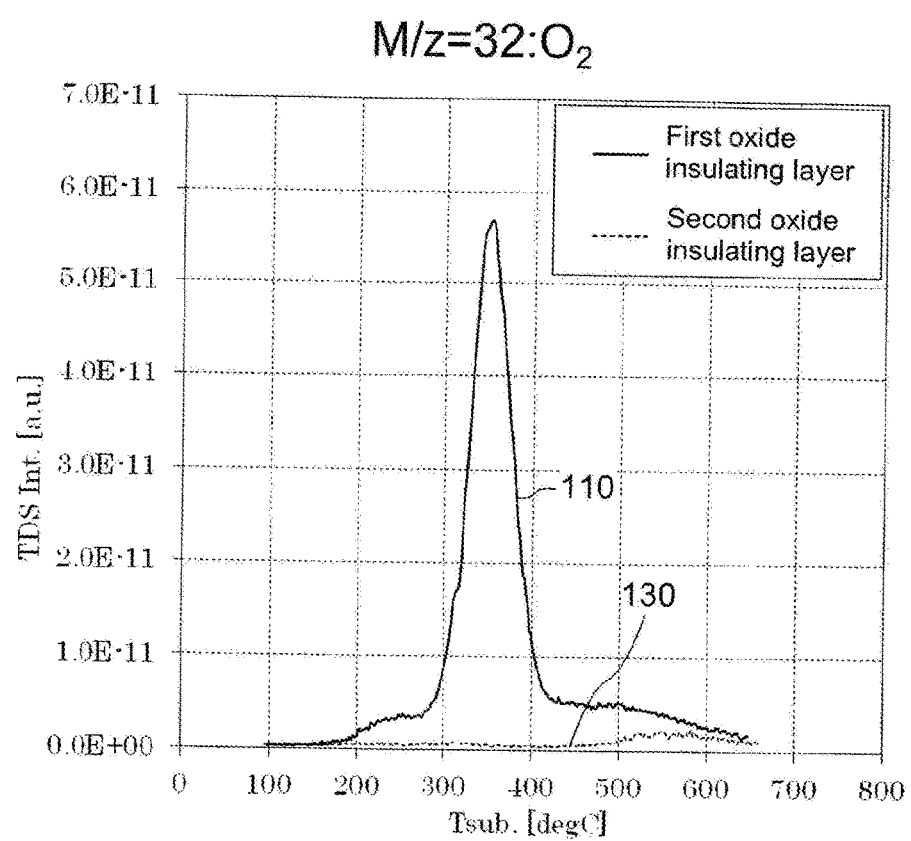
FIG. 8 is a diagram showing oxygen discharge characteristics of a first oxide insulating layer and a second oxide insulating layer used in a semiconductor device related to one embodiment of the present invention.
Figure 9:
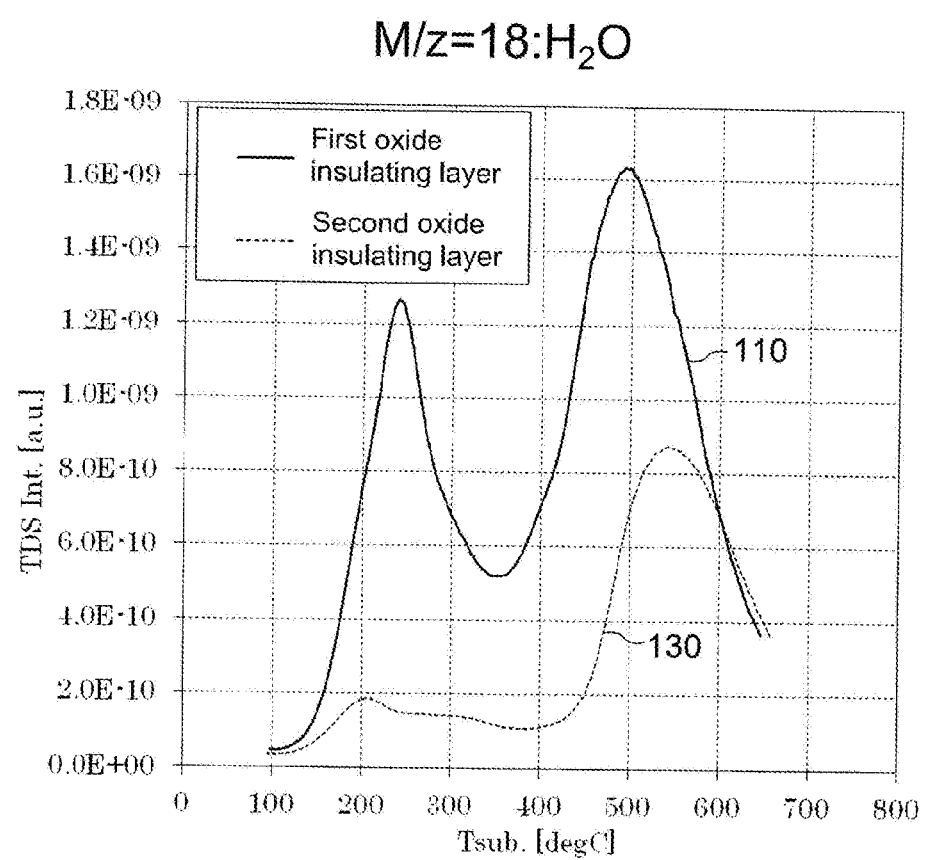
FIG. 9 is a diagram showing moisture discharge characteristics of a first oxide insulating layer and a second oxide insulating layer used in a semiconductor device related to one embodiment of the present invention.
Figure 10:
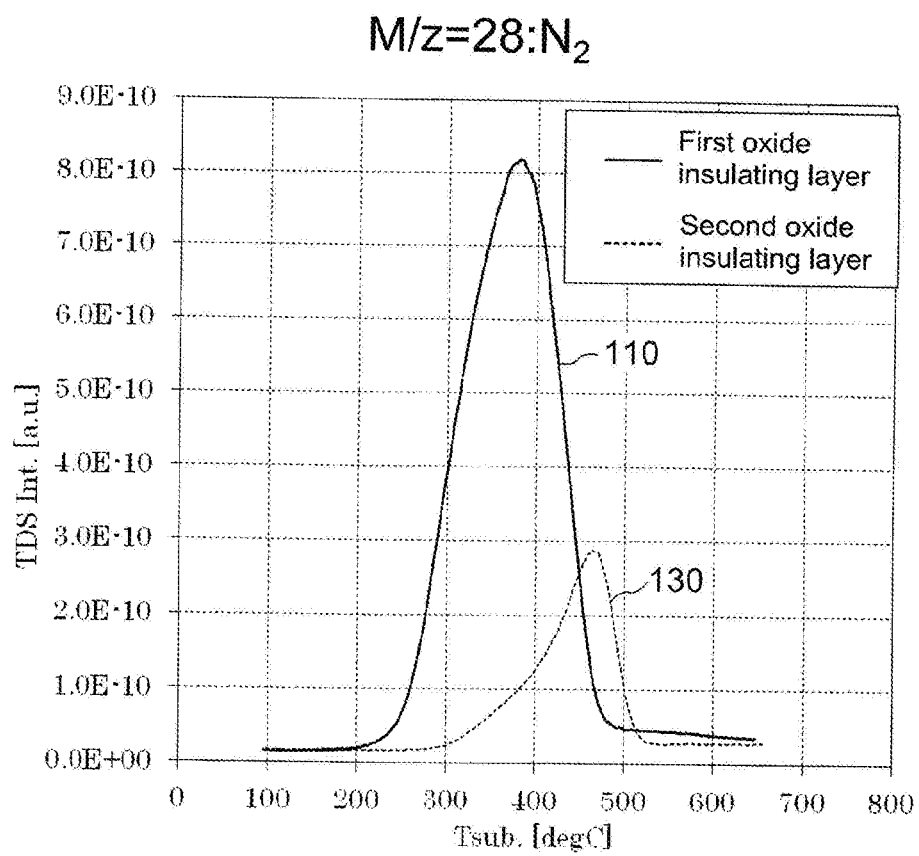
FIG. 10 is a diagram showing nitrogen discharge characteristics of a first oxide insulating layer and a second oxide insulating layer used in a semiconductor device related to one embodiment of the present invention.

The gas discharge characteristics of the first oxide insulating layer 110 and the second oxide insulating layer 130 are explained while referring to FIG. 8 to FIG. 10. The gas discharge characteristics of FIG. 8 to FIG. 10 show results measured using a thermal desorption spectroscopy analysis method (TDS analysis). The TDS analysis is an evaluation method in which an evaluation sample is placed on a heating stage arranged in a vacuum chamber and the mass of gas discharged from the evaluation sample is measured using a quadrupole mass spectrometer while raising the temperature of the heating stage. It is possible to identify the type of gas discharged from the evaluation sample from the mass analysis of the gas. The TDS analysis results in FIG. 8 to FIG. 10 are TDS analysis results in the case when $SiO_x$ is used as the first oxide insulating layer 110 and the second oxide insulating layer 130. In FIG. 8 to FIG. 10, the solid line spectrum is the TDS spectrum of the first oxide insulating layer 110, and the dotted line spectrum is the TDS spectrum of the second oxide insulating layer 130.

FIG. 8 is a diagram showing the oxygen discharge characteristics of a first oxide insulating layer and a second oxide insulating layer used in the semiconductor device according to one embodiment of the present invention. As is shown in FIG. 8, the first oxide insulating layer 110 discharges oxygen in the vicinity of 350° C. On the other hand, a clear peak is not confirmed which shows oxygen discharged from the second oxide insulating layer 130. In the TDS spectrum in FIG. 8, the result of the discharge of oxygen molecules (02: mass number 32) from the first oxide insulating layer 110 was obtained. It is considered that pairs of oxygen atoms which diffuse outwards within the first oxide insulating layer 110 are bonded to each other on the surface of the first oxide insulating layer 110 and are discharged as oxygen molecules. That is, in the structure shown in FIG. 7, it is considered that the oxygen atoms discharged from the first oxide insulating layer 110 are diffused as far the oxide semiconductor layer 140 via the opening 122 and fill oxygen defects.

FIG. 9 is a diagram showing moisture discharge characteristics of the first oxide insulating layer and the second oxide insulating layer used in the semiconductor device according to one embodiment of the present invention. As is shown in FIG. 9, the TDS spectrum of each of the first oxide insulating layer 110 and the second oxide insulating layer 130 has two peaks at 200° C. to 220° C. and 500° C. to 550° C. The moisture discharge amount of the first oxide insulating layer 110 is larger than the moisture discharge amount of the second oxide insulating layer 130.

FIG. 10 is a graph showing nitrogen discharge characteristics of the first oxide insulating layer and the second oxide insulating layer used in the semiconductor device according to one embodiment of the present invention. As is shown in FIG. 10, the TDS spectrum of the first oxide insulating layer 110 has a peak in the vicinity of 380° C., and the TDS spectrum of the second oxide insulating layer 130 has a peak in the vicinity of 460° C. The amount of nitrogen discharged from the first oxide insulating layer 110 is larger than the amount of nitrogen released from the second oxide insulating layer 130.

As is described above, according to the semiconductor device 10 related the first embodiment, since the oxygen blocking layer 120 having the opening 122 is arranged above the first oxide insulating layer 110 which includes a large amount of excess oxygen, it is possible to separately form the high resistance region (channel region 142) and the low resistance region (source region 144 and drain region 146) in the oxide semiconductor layer 140 just by performing a heat treatment. Although oxygen which is diffused from the first oxide insulating layer 110 by performing a heat treatment is diffuses outwards, the oxygen is blocked by the oxygen blocking layer 120 arranged above the first oxide insulating layer 110. Therefore, the oxygen is able to reach the oxide semiconductor layer 140 only in regions where the opening 122 is arranged. In this way, the oxygen defects in the oxide semiconductor layer 140 can be selectively repaired by the pattern of the opening 122.

In the direction L, the width of the gate electrode 160 is larger than the width of the opening 122, the oxide semiconductor layer 140 of the high resistance channel region 142 changes to a low resistance state in all regions of the oxide semiconductor layer 140 in the direction L due to the influence of an electric field caused by the gate electrode 160. Therefore, the ON current of the semiconductor device 10 improves. In the direction W, the pattern of the opening 122 crosses the pattern of the oxide semiconductor layer 140, that is, because the pattern of the oxide semiconductor layer 140 is separated into the source electrode 182 side and the drain electrode 184 side by the pattern of the opening 122, oxygen defects are repaired up to the end part in the direction W of the pattern of the oxide semiconductor layer 140. Many oxygen defects are sometimes formed at the end part of the pattern of the oxide semiconductor layer 140 due to the influence of the patterning process. When the pattern end part of the oxide semiconductor layer 140 in a state in which oxygen defects have been formed is continuous from the source region 144 up to the drain region 146, a leak current sometimes flows through this pattern end part. However, as described above, when oxygen defects up to the pattern end part in the direction W of the oxide semiconductor layer 140 are repaired, it is possible to suppress a leakage current from occurring as described above.

Second Embodiment

Figure 11:
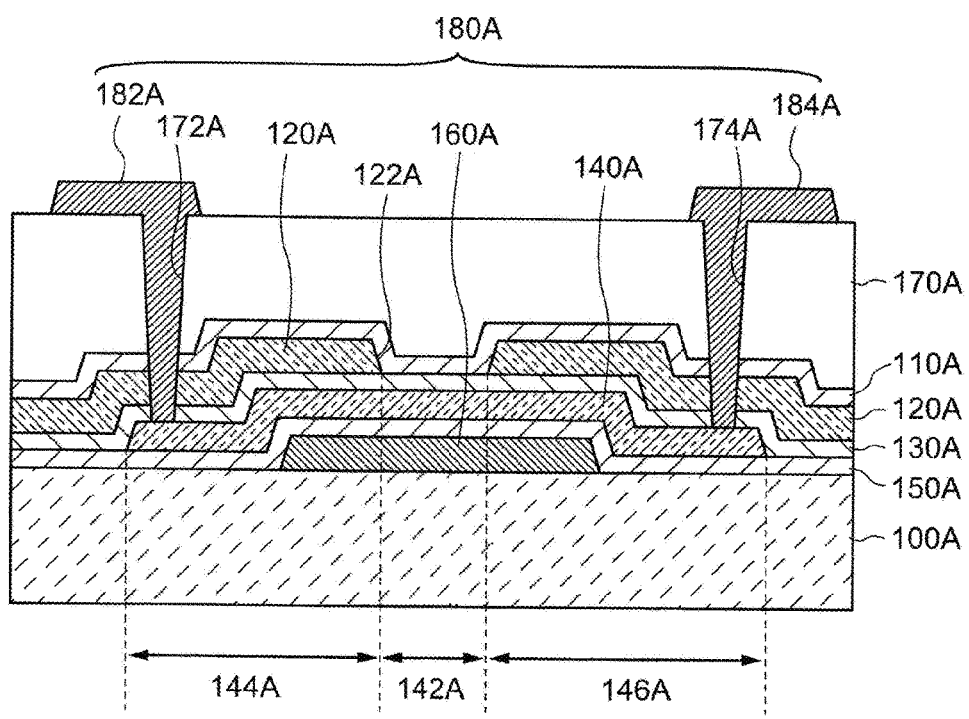
FIG. 11 is a cross-sectional diagram showing an outline of a semiconductor device related to one embodiment of the present invention.

An outline of a semiconductor device 10A according to the second embodiment of the present invention is explained while referring to FIG. 11. The semiconductor device 10A of the second embodiment can be applied to an LCD, a self-light emitting display device, a reflection type display device and an integrated circuit or the like the same as the semiconductor device 10 of the first embodiment. Although a top gate type transistor was explained in the first embodiment, a bottom gate type transistor is explained in the second embodiment.

[Structure of Semiconductor Device 10A]

FIG. 11 is a cross-sectional view showing an outline of a semiconductor device according to one embodiment of the present invention. Similar to the semiconductor device 10 shown in FIG. 2, the semiconductor device 10A shown in FIG. 11 includes a substrate 100A, gate electrode 160A, gate insulating layer 150A, oxide semiconductor layer 140A, second oxide insulating layer 130A, oxygen blocking layer 120A, first oxide insulating layer 110A, interlayer insulating layer 170A and a source/drain electrode 180A (source electrode 182A and drain electrode 184A).

The gate electrode 160A is arranged above the substrate 100A. The gate insulating layer 150A is arranged above the gate electrode 160A. The oxide semiconductor layer 140A is arranged above the gate insulating layer 150A. In the oxide semiconductor layer 140A, the oxide semiconductor layer 140A of the channel region 142A is arranged at a position overlapping the gate electrode 160A in a planar view. The second oxide insulating layer 130A is arranged above the oxide semiconductor layer 140A. The oxygen blocking layer 120A is arranged above the second oxide insulating layer 130A. The oxygen blocking layer 120A has an opening 122A which exposes the second oxide insulating layer 130A at a position corresponding to the channel region 142A. In a planar view, the opening 122A is arranged at a position overlapping with the gate electrode 160A. The first oxide insulating layer 110A is arranged above the oxygen blocking layer 120 A and the second oxide insulating layer 130A exposed by the opening 122A. The first oxide insulating layer 110A faces the oxide semiconductor layer 140A at a position overlapping the opening 122A in a planar view.

The interlayer insulating layer 170A is arranged above the first oxide insulating layer 110A. An opening 172A which exposes the oxide semiconductor layer 140A in the source region 144A and an opening 174A which exposes the oxide semiconductor layer 140A of the drain region 146A are arranged in the interlayer insulating layer 170A, the first oxide insulating layer 110A, the oxygen blocking layer 120A and the second oxide insulating layer 130A. The source electrode 182A is arranged inside the opening 172A. The drain electrode 184A is arranged inside the opening 174A. The source electrode 182A and the drain electrode 184A are respectively in contact with the oxide semiconductor layer 140A.

Each of the substrate 100A, the gate electrode 160A, the gate insulating layer 150A, the oxide semiconductor layer 140A, the second oxide insulating layer 130A, the oxygen blocking layer 120A, the first oxide insulating layer 110A, the interlayer insulating layer 170A and the source/drain electrode 180A can be formed from the same materials as those described in the first embodiment.

The structure of the semiconductor device 10A in FIG. 11 from the first oxide insulating layer 110A to the gate electrode 160A has a reverse stacked layer sequence to the structure of the semiconductor device 10 in FIG. 2 from the first oxide insulating layer 110 to the gate electrode 160. Therefore, in the manufacturing method of the semiconductor device 10A, a process for reducing the resistance of the oxide semiconductor layer 140A of the channel region 142A, the source region 144A and the drain region 146A, and a process for increasing the resistance of the oxide semiconductor layer 140A of the channel region 142A are different from the processes explained in the method of manufacturing the semiconductor device 10. In the manufacturing method of the semiconductor device 10 shown in FIG. 2, the resistance of the oxide semiconductor layer 140 of the channel region 142, the source region 144 and the drain region 146 is reduced when the gate insulating layer 150 is formed, and the resistance of the oxide semiconductor layer 140 is increased in the channel region 142 when the gate insulating layer 150 is formed or by a subsequent heat treatment. On the other hand, in the manufacturing method of the semiconductor device 10A, the resistance of the oxide semiconductor layer 140A of the channel region 142A, the source region 144A and the drain region 146A is reduced when the second oxide insulating layer 130A is formed, and the resistance of the oxide semiconductor layer 140A in the channel region 142A is increased when the first oxide insulating layer 110A is formed or by a subsequent heat treatment.

According to the structure shown in FIG. 11, it is not necessary to perform channel etching which was necessary for the ordinary bottom gate type transistor. That is, since the oxide semiconductor layer 140A in the channel region 142A is not exposed in the etching process, it is possible to reduce unnecessary damage to the oxide semiconductor layer 140A in the channel region 142.

Furthermore, the present invention is not limited to the embodiments described above and can be appropriately changed without departing from the concept of the present invention.

What is claimed is:

1. A semiconductor device comprising:
a first oxide insulating layer;
a barrier layer above the first oxide insulating layer, the barrier layer including an opening;
a second oxide insulating layer above the first oxide insulating layer at a position overlapping the opening;
an oxide semiconductor layer facing the first oxide insulating layer interposed by the second oxide insulating layer at a position overlapping the opening;
a gate electrode facing the oxide semiconductor layer at side opposite to the first oxide insulating layer with respect to the oxide semiconductor layer; and
a gate insulating layer between the oxide semiconductor layer and the gate electrode;
wherein
a contained amount of oxygen in the first oxide insulating layer is larger than a contained amount of oxygen in the second oxide insulating layer.

2. The semiconductor device according to claim 1, wherein an oxygen transmission rate of the barrier layer is lower than an oxygen transmission rate of the second oxide insulating layer.

3. The semiconductor device according to claim 2, wherein the barrier layer does not allow oxygen to pass through.

4. The semiconductor device according to claim 2, wherein the barrier layer is aluminum oxide.

5. The semiconductor device according to claim 4, wherein the oxide semiconductor layer is separated from the barrier layer by the second oxide insulating layer.

6. The semiconductor device according to claim 5, wherein a resistance ratio of the oxide semiconductor layer at a position overlapping the opening is higher than a resistance ratio of the oxide semiconductor layer above the barrier layer.

7. The semiconductor device according to claim 6, further comprising:
a source electrode connected to a source region of the oxide semiconductor layer; and
a drain electrode connected to a drain region of the oxide semiconductor layer;
wherein
the oxide semiconductor layer includes a first pattern;
the opening includes a second pattern; and
the second pattern crosses the first pattern.

8. The semiconductor device according to claim 7, wherein a width of the gate electrode is wider than a width of the opening in a direction from the source electrode towards the drain electrode.

9. A semiconductor device comprising:
a first oxide insulating layer, a ratio of oxygen in the first oxide insulating layer being larger than a ratio of oxygen in a composition ratio of a stoichiometry composition of the first oxide insulating layer,
a barrier layer above the first oxide insulating layer, the barrier layer including an opening;
an oxide semiconductor layer facing the first oxide insulating layer at a position overlapping the opening;
a gate electrode facing the oxide semiconductor layer at side opposite to the first oxide insulating layer with respect to the oxide semiconductor layer;
a gate insulating layer between the oxide semiconductor layer and the gate electrode; and
a second oxide insulating layer above the first oxide insulating layer exposed by the opening,
wherein an oxygen transmission rate of the barrier layer is lower than an oxygen transmission rate of the second oxide insulating layer, and
the barrier layer is aluminum oxide.

10. The semiconductor device according to claim 9, wherein the oxide semiconductor layer is separated from the barrier layer by the second oxide insulating layer.

11. The semiconductor device according to claim 10, wherein a resistance ratio of the oxide semiconductor layer at a position overlapping the opening is higher than a resistance ratio of the oxide semiconductor layer above the barrier layer.

12. The semiconductor device according to claim 11, further comprising:
a source electrode connected to a source region of the oxide semiconductor layer; and
a drain electrode connected to a drain region of the oxide semiconductor layer;
wherein
the oxide semiconductor layer includes a first pattern;
the opening includes a second pattern; and
the second pattern crosses the first pattern.

13. The semiconductor device according to claim 12, wherein a width of the gate electrode is wider than a width of the opening in a direction from the source electrode towards the drain electrode.

14. A semiconductor device comprising:
a gate electrode;
a gate insulating layer above the gate electrode;
an oxide semiconductor layer above the gate insulating layer, the oxide semiconductor layer overlapping the gate electrode;
a second oxide insulating layer above the oxide semiconductor layer;
a barrier layer above the second oxide insulating layer, the barrier layer including an opening at a position overlapping the gate electrode; and
a first oxide insulating layer facing the oxide semiconductor layer at a position overlapping the opening, a contained amount of oxygen in the first oxide insulating layer being larger than a contained amount of oxygen in the second oxide insulating layer.

* * * * *